(12) United States Patent
Haskara et al.

(10) Patent No.: US 12,224,412 B2
(45) Date of Patent: Feb. 11, 2025

(54) ARCHITECTURE AND METHOD OF THERMAL RUNAWAY PROGNOSTICS WITH MULTI-PARAMETER DATA FUSION

(71) Applicant: GM Global Technology Operations LLC, Detroit, MI (US)

(72) Inventors: Ibrahim Haskara, Macomb, MI (US); Bharatkumar Hegde, Bloomfield Hills, MI (US); Chen-fang Chang, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 313 days.

(21) Appl. No.: 17/967,380

(22) Filed: Oct. 17, 2022

(65) Prior Publication Data

US 2024/0128528 A1   Apr. 18, 2024

(51) Int. Cl.
*H01M 10/48* (2006.01)
*G01R 31/367* (2019.01)
*G01R 31/382* (2019.01)
*G01R 31/389* (2019.01)
*G01R 31/396* (2019.01)

(52) U.S. Cl.
CPC ........ *H01M 10/482* (2013.01); *G01R 31/367* (2019.01); *G01R 31/382* (2019.01); *G01R 31/389* (2019.01); *G01R 31/396* (2019.01); *H01M 2220/20* (2013.01)

(58) Field of Classification Search
CPC .......... H01M 10/482; H01M 2220/20; H01M 10/425; H01M 10/48; G01R 31/367; G01R 31/382; G01R 31/389; G01R 31/396; B60L 58/10; B60L 58/12; B60L 58/01
See application file for complete search history.

(56) References Cited

U.S. PATENT DOCUMENTS

2022/0163598 A1*   5/2022   Kang ................ H01M 10/4285

* cited by examiner

*Primary Examiner* — Ashley L Redhead, Jr.
(74) *Attorney, Agent, or Firm* — CANTOR COLBURN LLP

(57) ABSTRACT

A vehicle operates a system and method of predicting a thermal runaway event in a battery pack of the vehicle. The battery pack includes a battery cell. The sensor obtains measurements of a parameter of the battery cell at a plurality of times. The processor is configured to determine a value of at least one feature of the battery cell from the measurements of the parameter, determine a likelihood of the thermal runaway event from the value of the at least one feature, and take an action to prevent the thermal runaway event from occurring based on the likelihood.

20 Claims, 12 Drawing Sheets

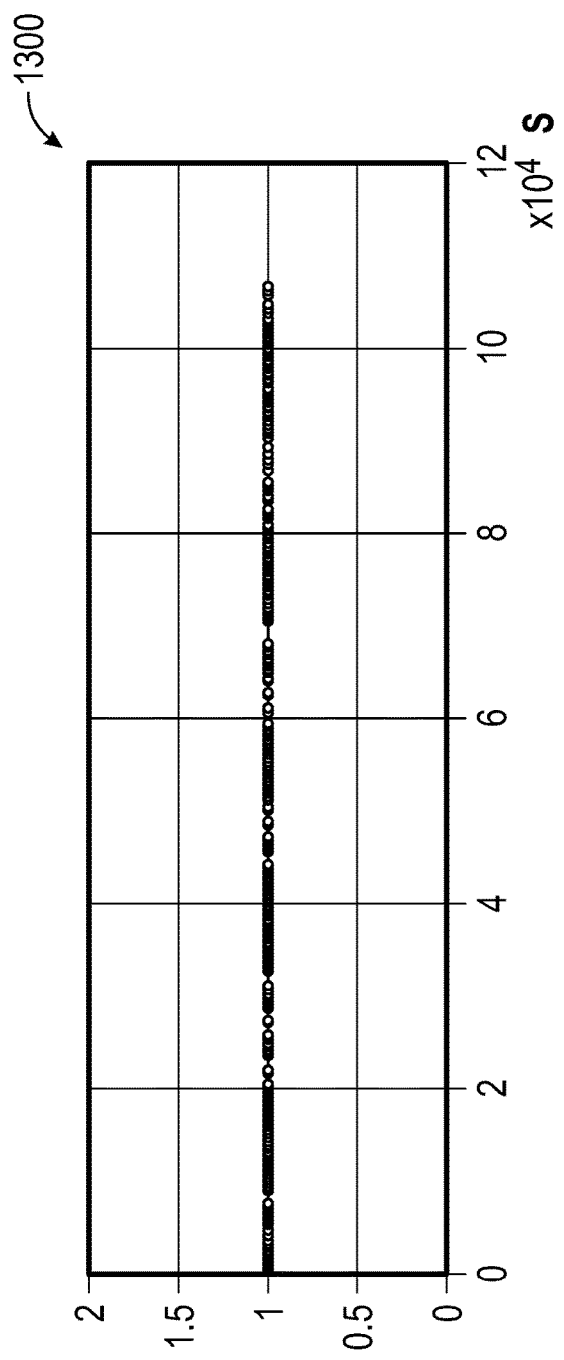

ARCHITECTURE AND METHOD OF THERMAL RUNAWAY PROGNOSTICS WITH MULTI-PARAMETER DATA FUSION

INTRODUCTION

The subject disclosure relates to a battery pack used in vehicles and, in particular, to a system and method for predicting the onset of a thermal runaway event in the battery pack in order to be able to prevent the event from occurring.

A battery pack used in a vehicle includes a plurality of battery cells that provide electrical power to the vehicle. Thermal runaway can occur in the battery pack when a short circuit occurring in one battery cell generates heat that causes a short circuit in a neighboring cell, which generates additional heat, leading to a cascade of short circuits. Methods for detecting when a thermal runaway commences leaves little time for taking preventative measures. Accordingly, it is desirable to provide a method for predicting a thermal runaway event prior to its occurrence.

SUMMARY

In one exemplary embodiment, a method of predicting a thermal runaway event in a battery pack of a vehicle is disclosed. Measurements are obtained of a parameter of a battery cell of the battery pack at a plurality of times. A value of at least one feature of the battery cell is determined from the measurements of the parameter. A likelihood of the thermal runaway event is determined from the value of the at least one feature. An action is taken to prevent the thermal runaway event from occurring based on the likelihood.

In addition to one or more of the features described herein, the feature is based on at least one of a relation between an open-circuit voltage and state of charge (SOC) of the battery cell at low SOC levels of the battery cell, a relation of power to SOC levels of the battery cell, a behavior of effective resistance with respect to SOC levels of the battery cell, and a behavior of charging rate with respect to a short resistance of the battery cell. The method further includes obtaining the measurements of the parameter when a computation window is active, wherein the computation window is active during a selected condition of the battery cell. The selected condition is at least one of a charging event, a discharging event, when a charge of the battery cell crosses a selected threshold value, and when a charge of the battery cell is within a selected SOC band. The likelihood includes a severity rank and a confidence value. The method further includes selecting a plurality of values of the at least one feature based on a selection criterion and determining the likelihood using the plurality of values. The method further includes calculating a plurality of likelihoods from the value of the at least one feature and calculating a composite likelihood from the plurality of likelihoods.

In another exemplary embodiment, a system for predicting a thermal runaway event in a battery pack of a vehicle is disclosed. The system includes a sensor and a processor. The sensor obtains measurements of a parameter of a battery cell of the battery pack at a plurality of times. The processor is configured to determine a value of at least one feature of the battery cell from the measurements of the parameter, determine a likelihood of the thermal runaway event from the value of the at least one feature, and take an action to prevent the thermal runaway event from occurring based on the likelihood.

In addition to one or more of the features described herein, the feature is based on at least one of a relation between an open-circuit voltage and state of charge (SOC) of the battery cell at low SOC levels of the battery cell, a relation of power to SOC levels of the battery cell, a behavior of effective resistance with respect to SOC levels of the battery cell, and a behavior of charging rate with respect to a short resistance of the battery cell. The processor is further configured to obtain the measurements of the parameter when a computation window is active, wherein the computation window is active during a selected condition of the battery cell. The selected condition is at least one of a charging event, a discharging event, when a charge of the battery cell crosses a selected threshold value, and when a charge of the battery cell is within a selected SOC band. The likelihood includes a severity rank and a confidence value. The processor is further configured to select a plurality of values of the at least one feature based on a selection criterion and determining the likelihood using the plurality of values. The processor is further configured to calculate a plurality of likelihoods from the value of the at least one feature and calculate a composite likelihood from the plurality of likelihoods.

In yet another exemplary embodiment, a vehicle is disclosed. The vehicle includes a battery pack having a battery cell, a sensor, and a processor. The sensor obtains measurements of a parameter of the battery cell at a plurality of times. The processor is configured to determine a value of at least one feature of the battery cell from the measurements of the parameter, determine a likelihood of a thermal runaway event from the value of the at least one feature, and take an action to prevent the thermal runaway event from occurring based on the likelihood.

In addition to one or more of the features described herein, the feature is based on at least one of a relation between an open-circuit voltage and state of charge (SOC) of the battery cell at low SOC levels of the battery cell, a relation of power to SOC levels of the battery cell, a behavior of effective resistance with respect to SOC levels of the battery cell, and a behavior of charging rate with respect to a short resistance of the battery cell. The processor is further configured to obtain the measurements of the parameter when a computation window is active, wherein the computation window is active during a selected condition of the battery cell. The selected condition is at least one of a charging event, a discharging event, when a charge of the battery cell crosses a selected threshold value, and when a charge of the battery cell is within a selected SOC band. The processor is further configured to select a plurality of values of the at least one feature based on a selection criterion and determining the likelihood using the plurality of values. The processor is further configured to calculate a plurality of likelihoods from the value of the at least one feature and calculate a composite likelihood from the plurality of likelihoods.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 13 shows a graph comparing of effective resistance to the internal resistance of the battery cell during a discharging event;

FIG. 14 shows a similar graph to FIG. 13 for when the battery cell is charging.

DETAILED DESCRIPTION

Figure 1:
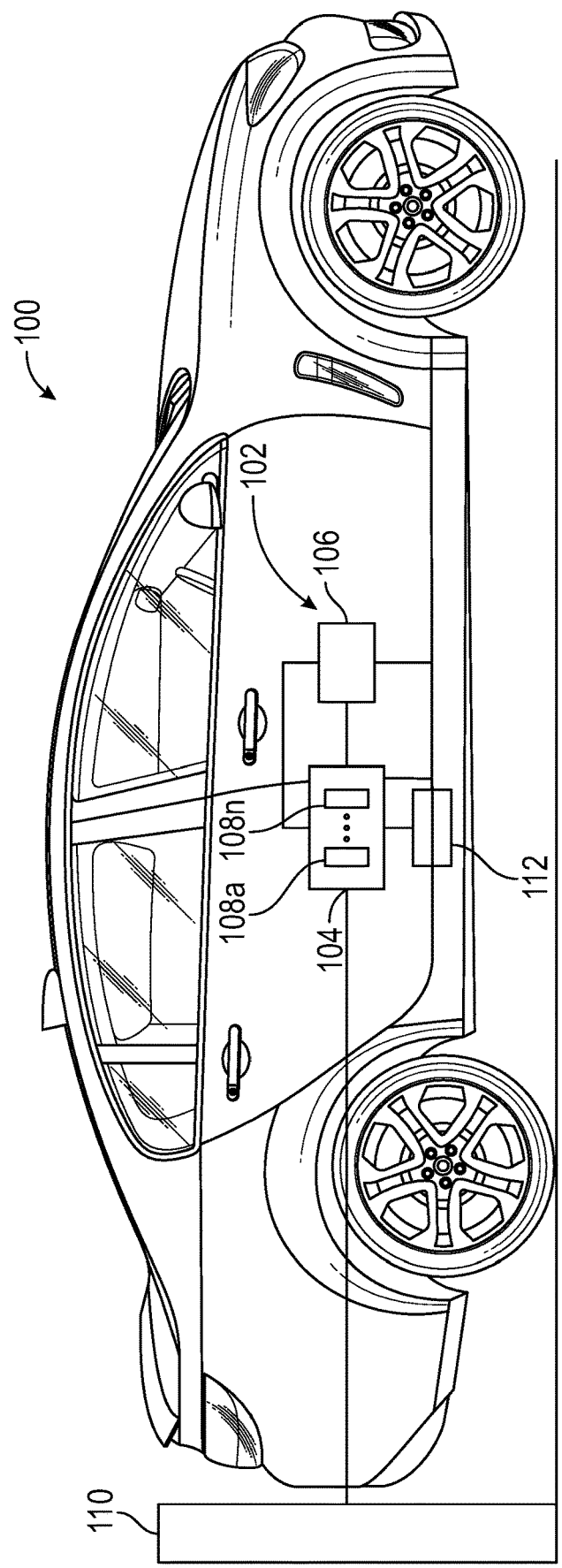
FIG. 1 shows a vehicle in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a vehicle 100. The vehicle 100 can be a conventional gasoline-powered vehicle, a diesel-powered vehicle, a hybrid vehicle, an electric vehicle, etc. The vehicle 100 includes an electrical system 102 including a battery pack 104 and one or more electrical loads 106 which operate using power provided by the battery pack. The battery pack 104 can include a plurality of battery cells 108a-108n and one or more sensors (not shown) that obtain measurements of parameters of the battery pack and battery cells. As shown in FIG. 1, the vehicle is plugged into a charging station 110 which charges the battery pack 104 and the battery cells 108a-108n.

The vehicle 100 further includes a controller 112. The controller 112 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The controller 112 may include a non-transitory computer-readable medium that stores instructions which, when processed by one or more processors of the controller 112, implement a method of predicting a thermal runaway event and controlling operation of the vehicle 100, the electrical system 102, battery pack 104, battery cells 108a-108n and/or electrical loads 106, based on the prediction, and to send a warning signal or take preventative action, according to one or more embodiments detailed herein.

Figure 2:
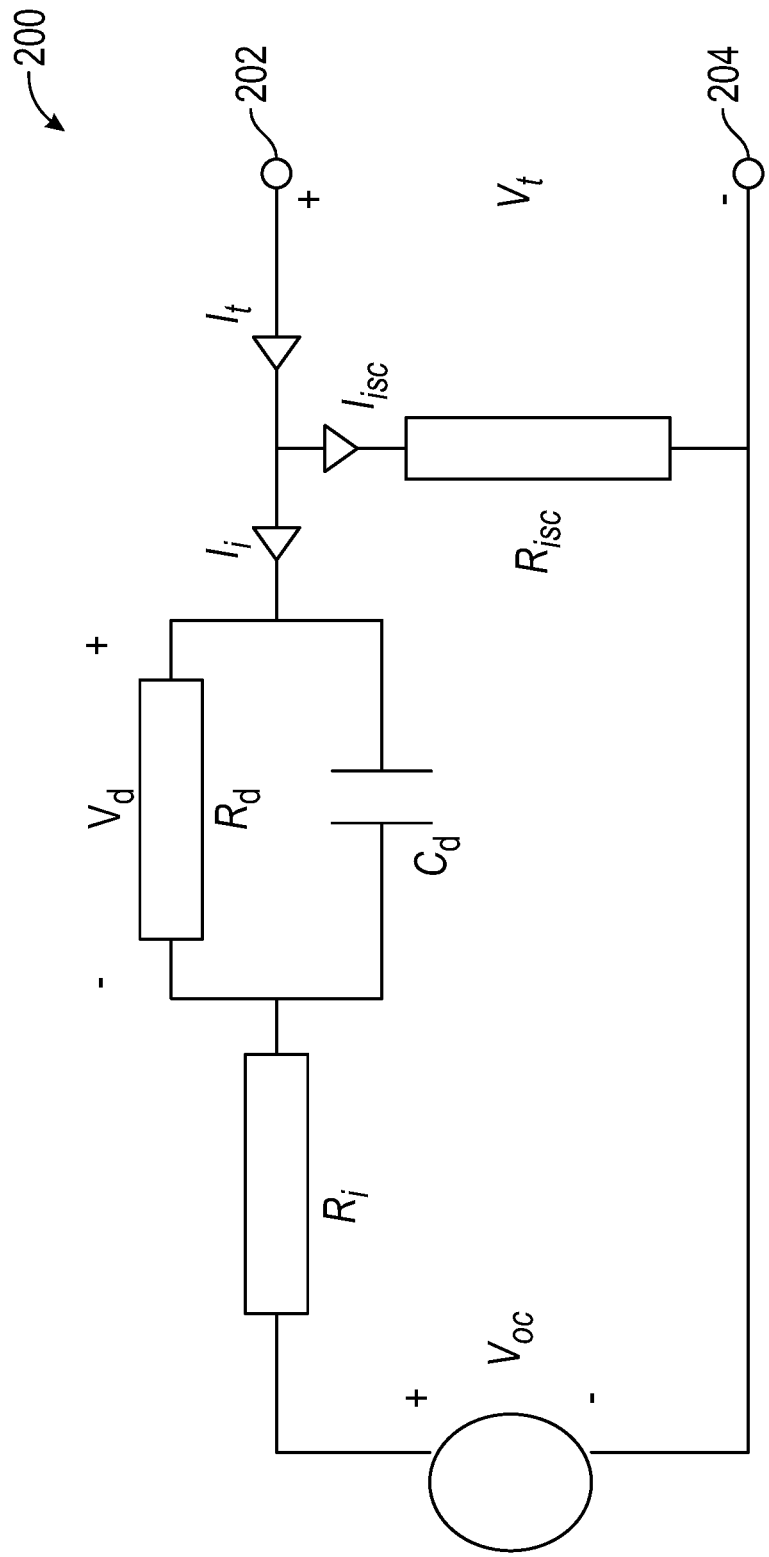
FIG. 2 shows a circuit diagram of a battery cell in an illustrative embodiment.

FIG. 2 shows a circuit diagram 200 of a battery cell in an illustrative embodiment. The circuit diagram 200 includes an open circuit voltage $V_{OC}$ and an internal resistance $R_i$ of the battery cell. The battery cell includes a diffusion layer that introduces a diffusion layer voltage $V_d$ based on a diffusion layer resistance $R_d$ and a diffusion layer capacitance $C_d$. A voltage measurement V(t) of the battery cell can be taken across a first node 202 and a second node 204. A short circuit resistance $R_{isc}$ is shown between first node 202 and second node 204. The short circuit resistance $R_{isc}$ serves as a representation of an internal short of the battery cell, especially prior to a potential thermal runaway event. The internal short can be caused by many factors, such as cell anomalies, a torn anode, melting, etc. The location of the internal short can vary within the battery cell, and the magnitude of the internal short can change based on the health of the battery. When the battery cell is healthy and there is no short-circuit, the short circuit resistance $R_{isc}$ is infinite (i.e., $R_{isc}=\infty$). When there is a total short circuit, $R_{isc}=0$. The methods herein measure the short circuit resistance levels before a total short circuit occurs.

An applied charging current $I_t$ is shown being applied to the battery cell at first node 202. An internal current $I_i$ that reaches the battery cell is related to the applied charging current $I_t$ and a short current $I_{isc}$ lost through a short in the battery cell by Kirchoff's Law, as shown in Eq. (1):

$$I_t = I_i + I_{isc} \qquad \text{Eq. (1)}$$

The measured voltage $V_t$ is related to the amount of internal current $I_i$ that enters into the battery cell, as shown by Eq. (2):

$$V_t = V_{oc} + R_i I_i + V_d \qquad \text{Eq. (2)}$$

When there is no short-circuit, (i.e., $R_{isc}=\infty$) the short current $I_{isc}$ is zero and the internal current is equal to the applied charging current (i.e., $I_{isc}=0$, $I_i=I_t$). When there is a total short circuit (i.e., $R_{isc}=0$), the short current $I_{isc}$ is equal to $I_t$ and the internal current is zero (i.e., $I_{isc}=I_t$, $I_i=0$).

Figure 3:
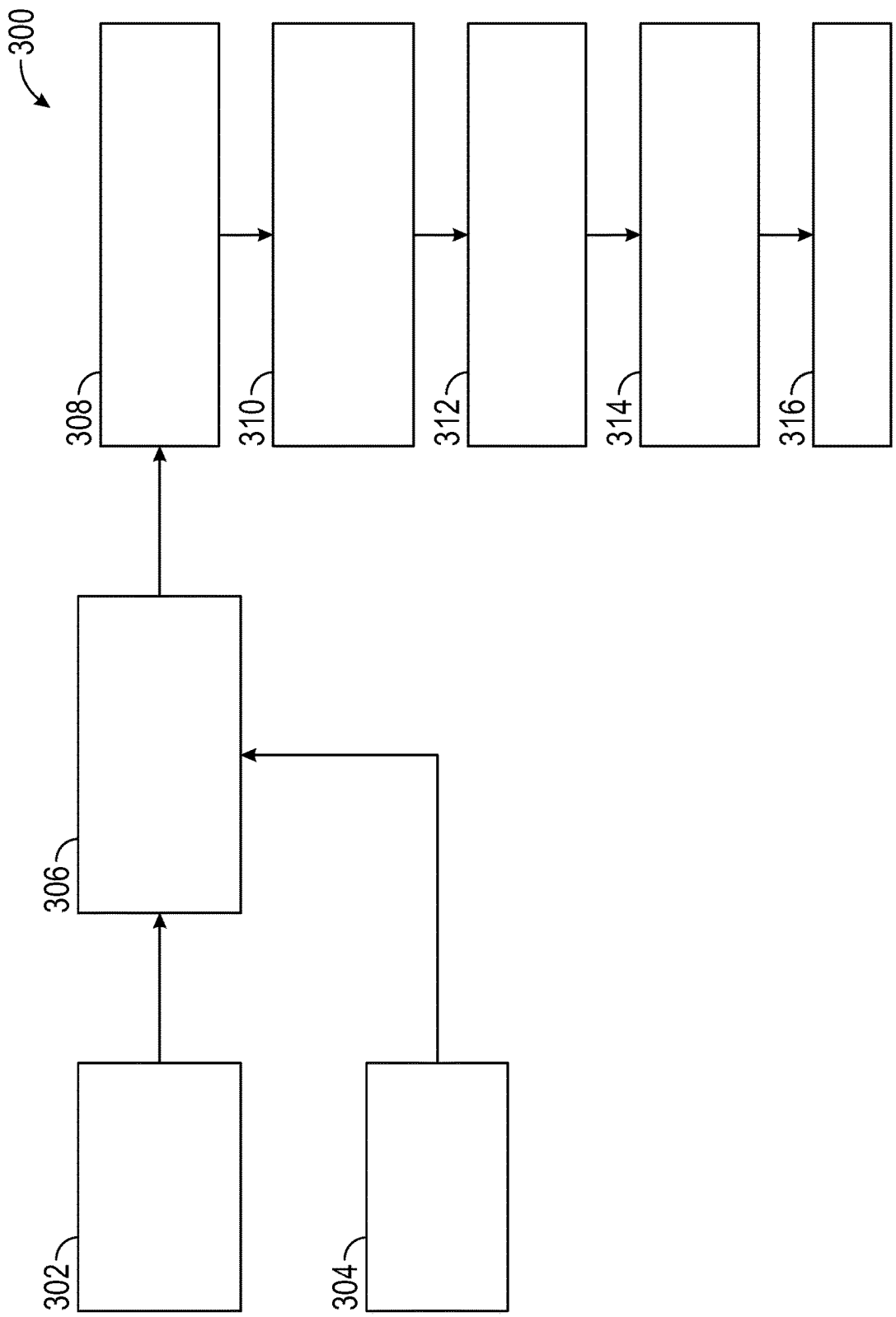
FIG. 3 shows a flowchart of a method for predicting a thermal runaway event in a battery pack, in an illustrative embodiment.

FIG. 3 shows a flowchart 300 of a method for predicting a thermal runaway event in a battery pack, in an illustrative embodiment. The method includes obtaining measurements of parameters over time during a computation window and calculating one or more values of at least one feature of the battery pack from the obtained measurements. The parameters can be a current, voltage, temperature, etc. of a battery cell or of the battery pack. The one or more values can be used to calculate one or more likelihoods that are predictive of an onset of a thermal runaway event. A warning signal can then be provided to a driver or passenger or an operation can be taken to prevent the thermal runaway event from occurring.

A feature can be a relation between parameters of the battery cell or a behavior or pattern of the one or more parameters during given conditions. The feature value can be calculated using parameters that are measured during a given computation window, such as during a charging event, a discharge event, at low charge, etc. Exemplary features include a relation between open circuit voltage ($V_{OC}$) and a state of charge (SOC) at low SOC value of the battery cell, a relation of cell power to SOC at various a short-circuit conditions of the battery cell, a pattern of effective resistance in the presence of a short circuit condition, and a charging rate during charging of the battery cell.

In box 302, parameter measurements are obtained from a battery cell and/or the battery pack. The parameter measurements are obtained continuously or as a stream of data from relevant sensors of the battery pack. The parameter measurements can include current, voltage, temperature, etc.

Figure 4:
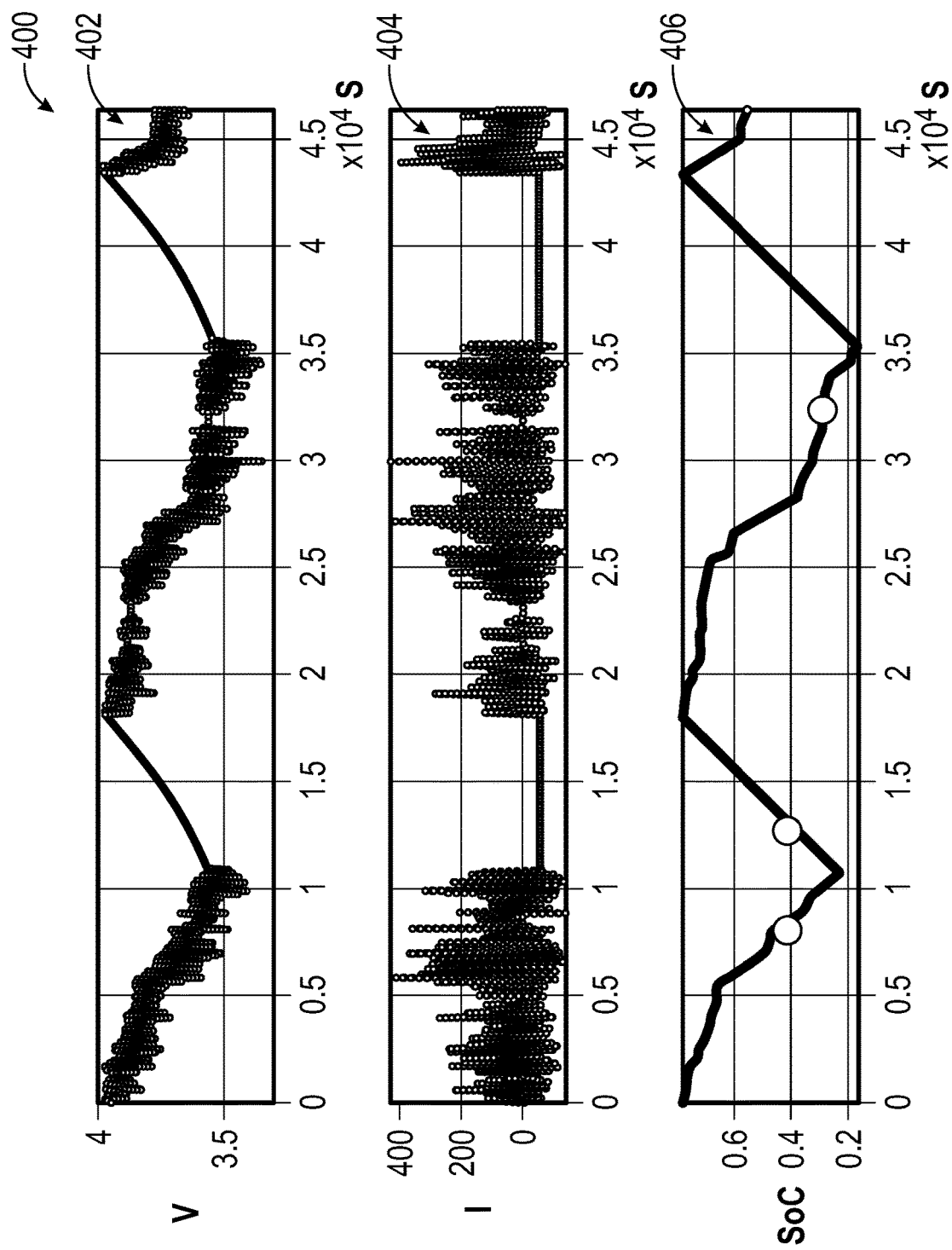
FIG. 4 shows a plurality of graphs 400 showing various parameter measurements.

FIG. 4 shows a plurality of graphs 400 showing various parameter measurements. Graph 402 shows a cell voltage measurement obtained over time. Graph 404 shows battery cell current measurements obtained over time. Graph 406 shows SOC measurements obtained over time. For each graph, time is shown along the abscissa (in $10^4$ seconds).

Returning to FIG. 3, in box 304, a computation window is defined or selected. The computation window defines a situation or condition of the battery cell for which a parameter of the battery pack or battery cell is to be selected for subsequent computations. For example, the computation window can be active when the battery is charging, discharging, when the state of charge (SOC) of the battery cell crosses a threshold level or is within a given charge band of charge range of the battery cell, etc. Since the conditions under which a first computation window is active are unrelated to the conditions under which a second computation window is active, the timing between computation windows is asynchronous. In addition, there is no relation between the number of times one computation window is active and another computation window is active.

Figure 5:
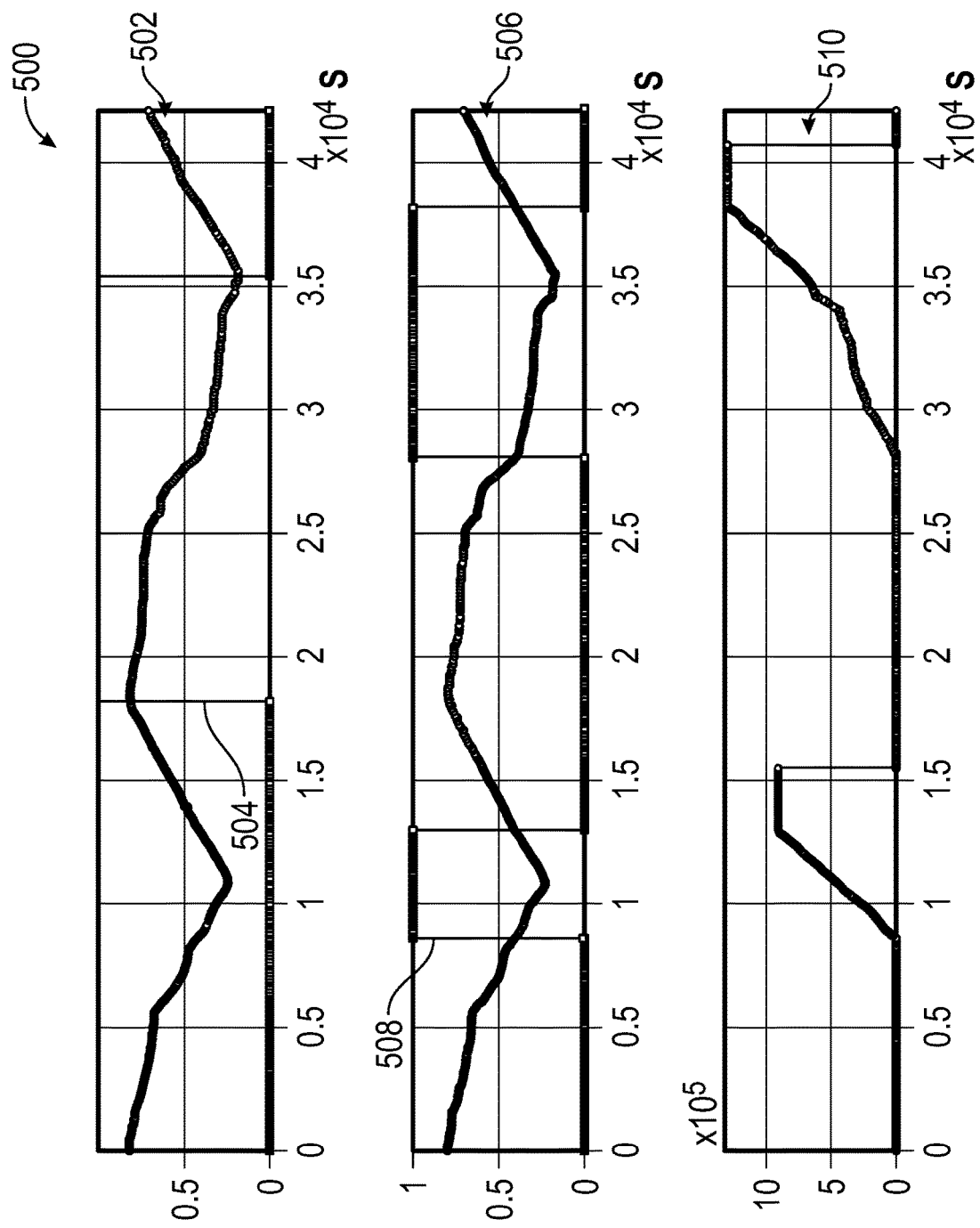
FIG. 5 shows a plurality of graphs showing various parameter measurements and computation windows.

FIG. 5 shows a plurality of graphs 500 showing various parameter measurements and computation windows. Graph 502 shows state of charge over time and a first computation window 504 that is activated when the vehicle is being driven after a charge. The first computation window is activated at about $t=1.7\times10^4$ seconds and is deactivated at about $t=3.55\times10^4$ seconds. Graph 506 shows the state of charge over time with a second computation window 508 that is activated and deactivated when the SOC value cross a given SOC threshold (e.g., SOC=0.4). Graph 510 shows cumulate power during the second computation window 508 of Graph 506. For each graph, time is shown along the abscissa (in $10^4$ seconds).

Referring back to FIG. 3, in box 306, the values of one or more features of the battery pack are computed using the parameter measurements received while the corresponding computation window is active. The timing for and the number of times a value of the feature is related to the timing and number of times its corresponding computation window is active. Therefore, there is no relation between the number of times a value of a first feature is calculated and a number of times a value of a second feature is calculated. Additionally, there is no temporal relation between these values.

Figure 6:
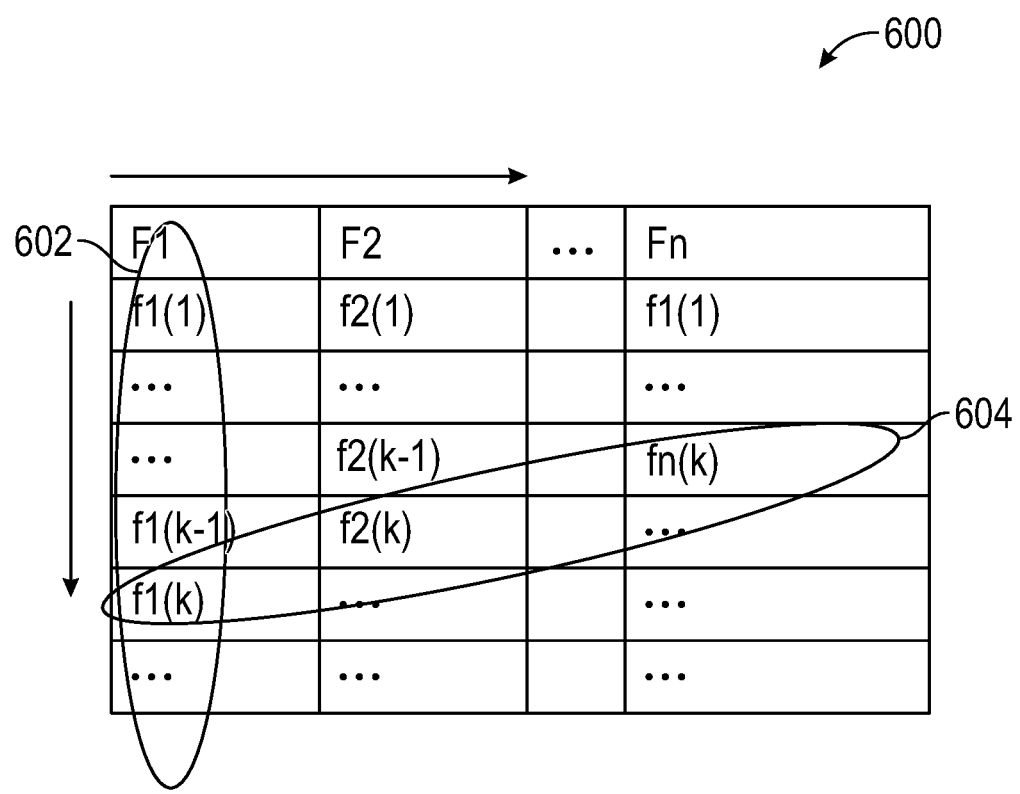
FIG. 6 shows a feature progression matrix in an illustrative embodiment.

In box 308, as each value is computed, it is placed in a feature progression matrix. FIG. 6 shows a feature progression matrix 600 in an illustrative embodiment. Each column of the feature progression matrix is designated for a corresponding feature and each row stores a value that is computed for the corresponding feature. Column headers are labelled F1, F2, . . . , Fn, indicating the first feature, the second feature, . . . and the $n^{th}$ feature. Each time a new feature value is calculated, it is entered under its appropriate column. Under the column for F1, entries f1(1), f1(2), . . . f1(k−1), f1(k) are entered in the order they are calculated. Thus, the first entry or earliest entry is in the top row and the latest or most recent entry is in the bottom row. Due to the asynchronous nature of calculating feature values, the number of values stored in a first feature column of the feature progression matrix can be different from the number of values for a second feature column.

Returning to FIG. 3, in box 310, a feature fusion is performed using the values stored in the feature progression matrix (600, FIG. 6). Feature fusion includes selecting feature values based on a selection criterion and calculating an aggregate value. In one embodiment, a selection criterion includes selecting the values for a single feature (i.e., values from a single column of the feature progression matrix). The selection criterion is illustrated by ellipse 602 in FIG. 6. In another embodiment, a selection criterion includes selecting the most recent feature values (e.g., latest entry) for each feature is illustrated by ellipse 604 in FIG. 6. In yet another embodiment, a selection criterion includes selecting a subset of features, such as all features related to a charging event, for example.

In box 312, the fused data is mapped to a likelihood of a thermal runaway event. The mapping can be performed at a processor of the vehicle or at a remote processor. The mapping can be performed using a data-driven classification algorithm, a regression algorithm and/or a neural network. The mapping generates a severity rank S and a confidence value P. The severity rank is a number indicating a health level of a battery pack or battery cell. For example, S=1 for a healthy battery cell and S=4 for a non-healthy battery cell. The real-time mapping includes selecting values of a feature and assigning the severity rank and the to the values.

Multiple likelihoods can be calculated based on the different fusion criteria discussed with respect to box 310. For example, a first mapping uses values from an individual column of the matrix (see ellipse 602, FIG. 6) and generates a first severity rank and probability, as shown in Eq. (3):

$$(S_{ind}, P_{ind}) = M_{ind}(f_{i,k}, f_{i,k-1}, \ldots, f_{i,1})$$ Eq. (3)

where $f_{i,k}$ is the feature value selected from column i, and row k. The subscript 'ind' indicates values selected from a single column (i.e., for an "individual" feature). A second mapping uses the latest values or most recent entries in each column (see ellipse 604, FIG. 6) and generates a second severity rank and probability, as shown in Eq. (4):

$$(S_{all}, P_{all}) = M_{all}(f_{1,k}, f_{2,k}, \ldots, f_{n,k})$$ Eq. (4)

The subscript 'all' indicates the last values entered in the feature progression matrix in all columns (i.e., for all features). A third mapping uses a subset of values selected based a specified condition of the battery cell and generates a third severity rank and probability, as shown in Eq. (3):

$$(S_{sub}, P_{sub}) = M_{sub}(f_{i,k}, f_{j,k}, \ldots)$$ Eq. (5)

The subscript 'sub' indicates a subset of features selected during a specified criterion (e.g., only during charging).

Figure 7:
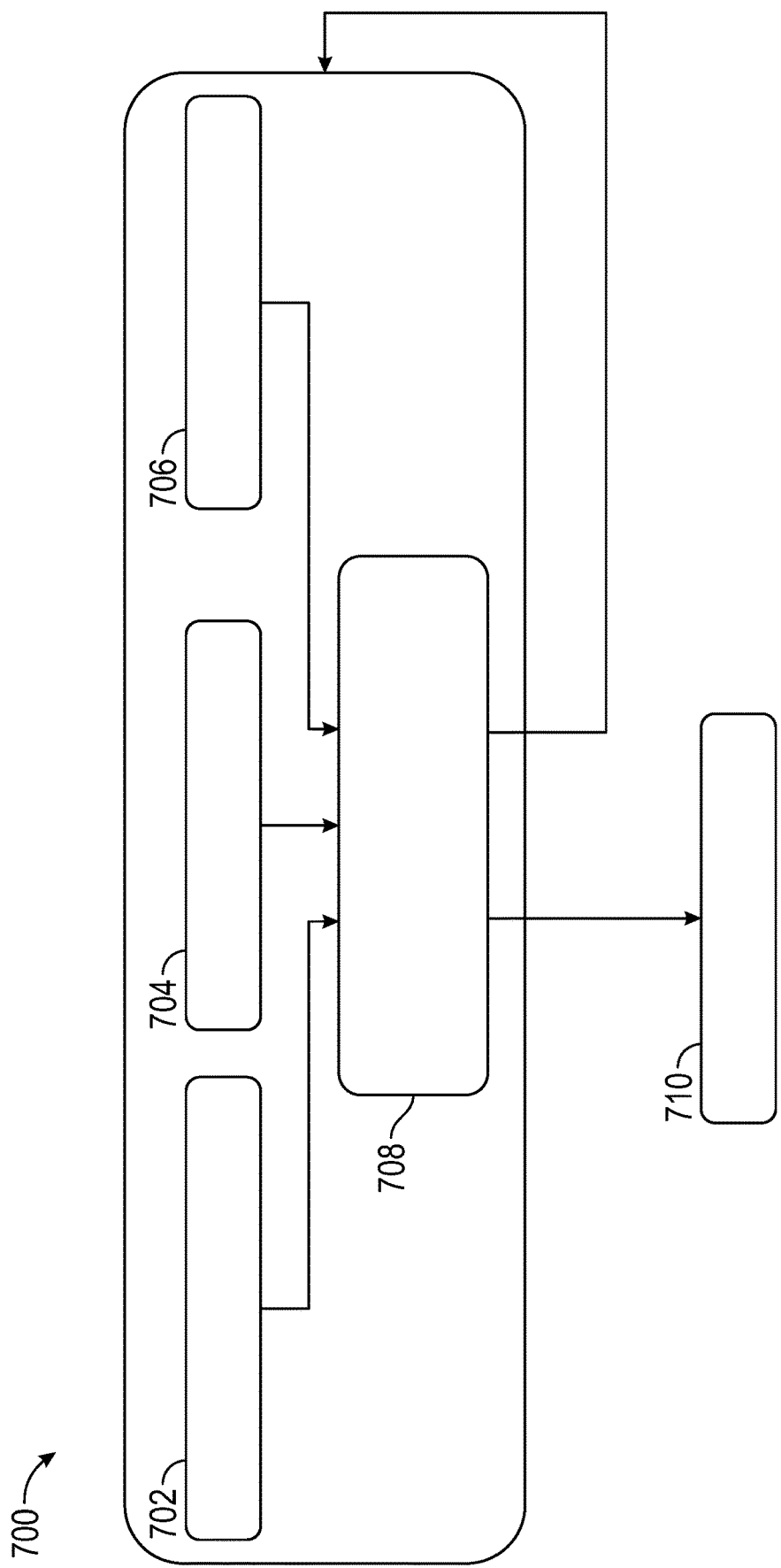
FIG. 7 shows a diagram illustrating merging of multiple likelihoods to create a composite likelihood.

In box 314, the multiple likelihoods are merged to create a composite likelihood (i.e., composite severity rank and composite probability). FIG. 7 shows a diagram 700 illustrating this merging. Box 702 stores the likelihoods ($S_{ind}$, $P_{ind}$). Box 704 stores the likelihood ($S_{all}$, $P_{all}$). Box 706 stores the likelihoods ($S_{sub}$, $P_{sub}$). In box 708, these likelihoods are merged using, for example, Eq. (6):

$$S_c = \Sigma S_{ind} * P_{ind} + \Sigma S_{sub} * P_{sub} + S_{all} * P_{all}$$ Eq. (6)

The composite likelihood $S_c$ can be used to predict a condition for which a thermal runaway event can occurs. In box 710, the composite likelihood can be stored in a truth table. A likelihood state which includes a high severity and low confidence can be used to trigger a warning signal. A processor can wait through likelihood state which includes a low severity and a low confidence without sending a warning signal. The composite likelihood can be compared to the likelihoods of boxes 702, 704 and 706 to identify fault type. The comparison identifies the mapping with the highest contribution to the composite likelihood, reconfirms the mappings and determines a likely fault mode.

Returning to FIG. 3, in box 316, the composite likelihood can be used to generate a warning signal or cause a preventive action to be taken to prevent a thermal runaway event from occurring. The warning signal can tell an occupant of the vehicle of the need to take a specified action (i.e., take the vehicle to the shop, replace battery, etc.). A preventive action can include controlling the vehicle to disconnect a battery cell or cells, reduce electrical loads on the battery, etc.

Figure 8:
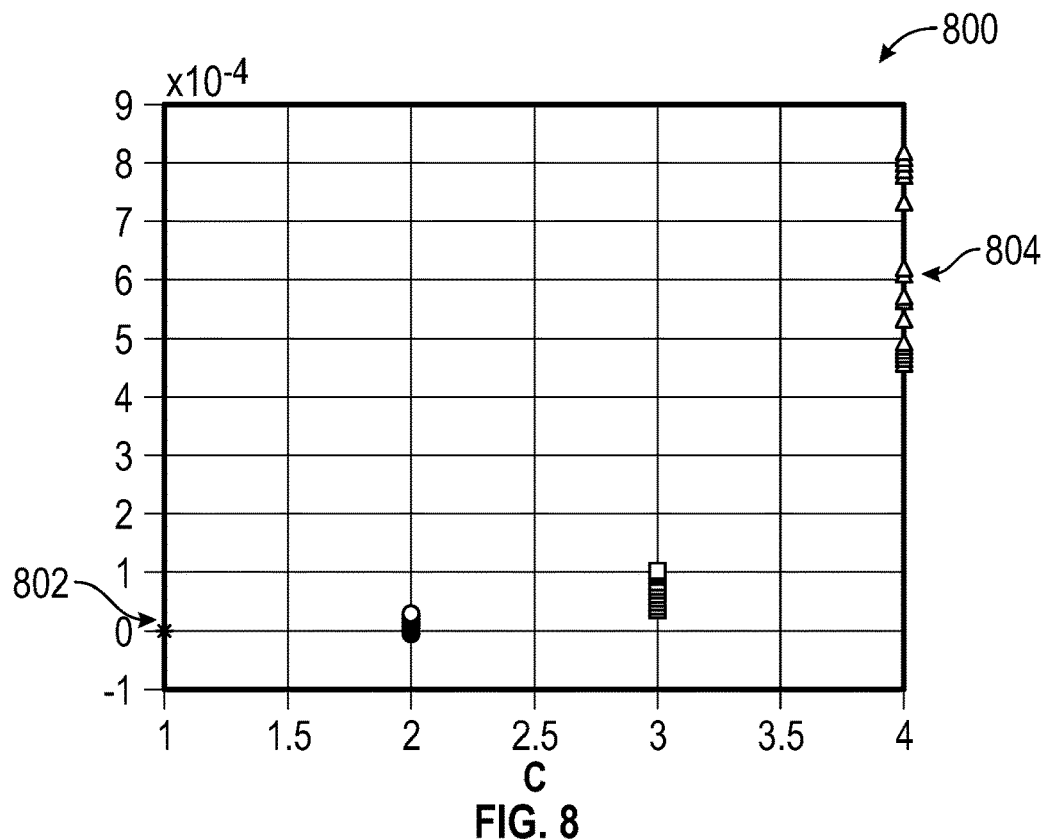
FIG. 8 shows a graph illustrating a relation between open-circuit voltage to state of charge at low state of charge level for different conditions of a battery cell.

FIG. 8 shows a graph 800 illustrating a relation between open-circuit voltage to state of charge at low state of charge level (i.e., Voc vs. SOC at low SOC) for different conditions of a battery cell. Case numbers (C) are shown along the abscissa and feature values (unitless) are shown along the ordinate axis in voltage. Case 1 represents a healthy battery cell, while health of the battery cell decreases as the case number increases. Case 4 represents a very unhealthy battery cell that is close to having a short circuit. As shown in FIG. 6, for a healthy battery (case 1) an average of the values 802 for case 1 is low and a variance of the values is also small. For an unhealthy battery (case 4), the average 804 of the feature values is increased as the variance is greater. The likelihood of a short-circuit and/or a thermal runaway event can thus be calculated using the average value and variance.

Figure 9:
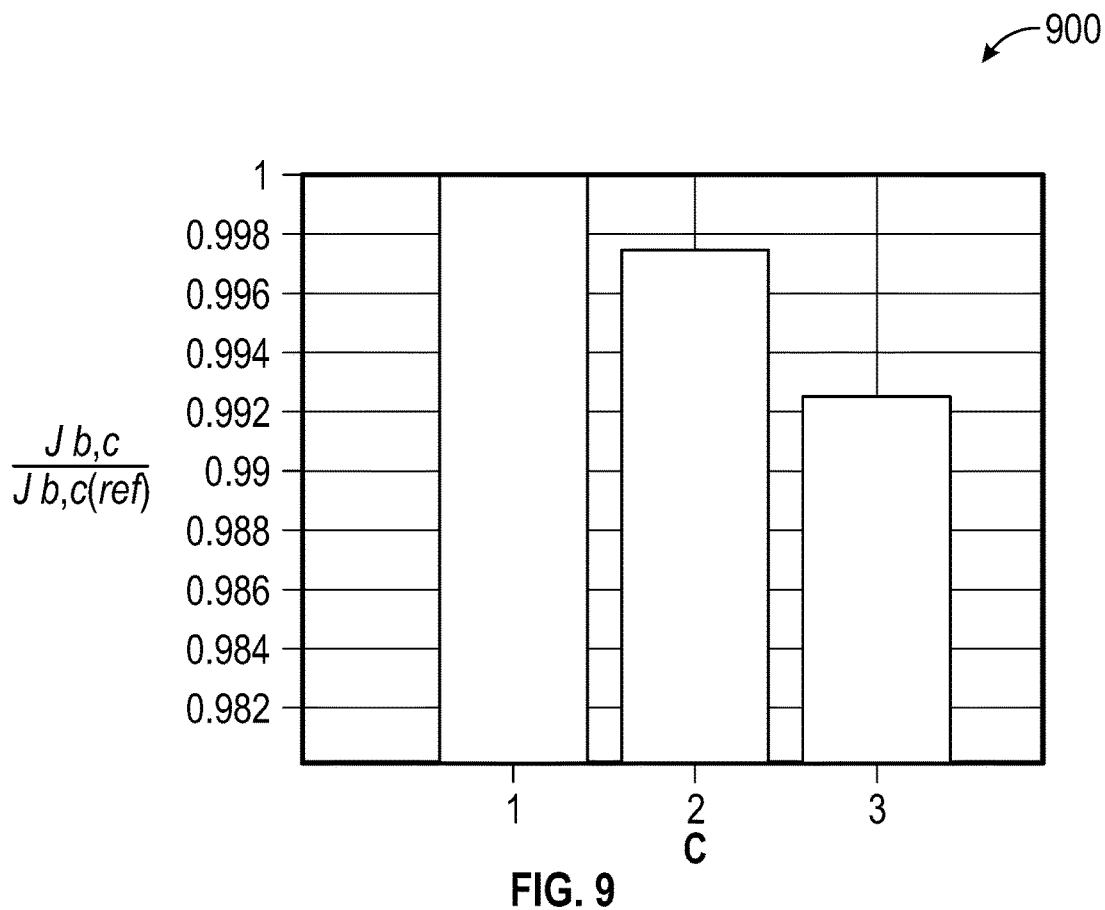
FIG. 9 shows a graph illustrating a feature of battery cell power over different SOC bands.

FIG. 9 shows a graph 900 illustrating a feature of battery cell power over different SOC bands. The feature indicates how much power can be drawn from the battery cell when the battery cell is at different charge levels (or is within different ranges or bands of SOC). The power can be sampled at different SOC bands while the battery is charging and/or discharging (e.g., during driving). Case numbers (C) are shown along the abscissa and feature values are shown along the ordinate axis. The feature value is a unitless quantity since it is a ratio of cumulative power to a reference value. Case 1 represents a healthy battery cell, case 2 represents a faulty battery cell while case 3 represents an even more unhealthy battery cell. For case 1, the power ratio is high (at about 1). The power ratio decreases for case 2 and case 3 as the health of the battery decreases. Thus, the likelihood of a short-circuit and/or a thermal runaway event can be determined from the power ratio.

Figure 10:
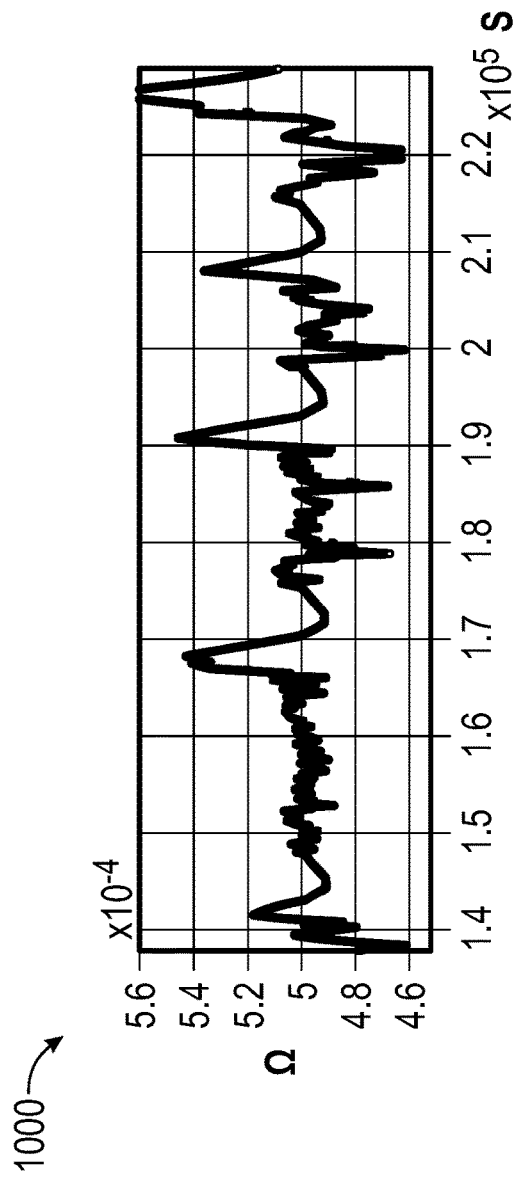
FIG. 10 shows a graph illustrating effective resistance over time for a battery cell.

FIGS. 10-14 illustrate a method for determining a likelihood using an effective resistance of a battery cell. FIG. 10 shows a graph 1000 illustrating effective resistance over time for a battery cell. Time is shown along the abscissa (in×10$^5$ seconds) and resistance is shown along the ordinate axis. The effective resistance is given by Eq. (7):

$$R_{eff} = \left| \frac{V_t - V_{OC}}{I_t} \right| \quad \text{Eq. (7)}$$

The effective resistance can be determined using a Kalman filter.

Figure 11:
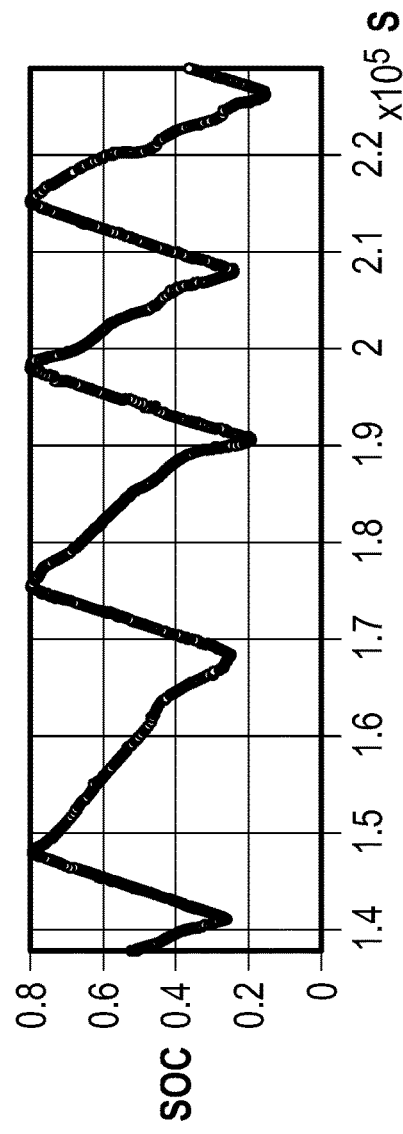
FIG. 11 shows a graph illustrating state of charge over time for the battery cell.

FIG. 11 shows a graph 1100 illustrating state of charge over time for the battery cell. Time is shown along the abscissa (in×10$^5$ seconds) and state of charge is shown along the ordinate axis. As shown in FIG. 11, the battery cell goes through a plurality of charging and discharging cycles.

Figure 12:
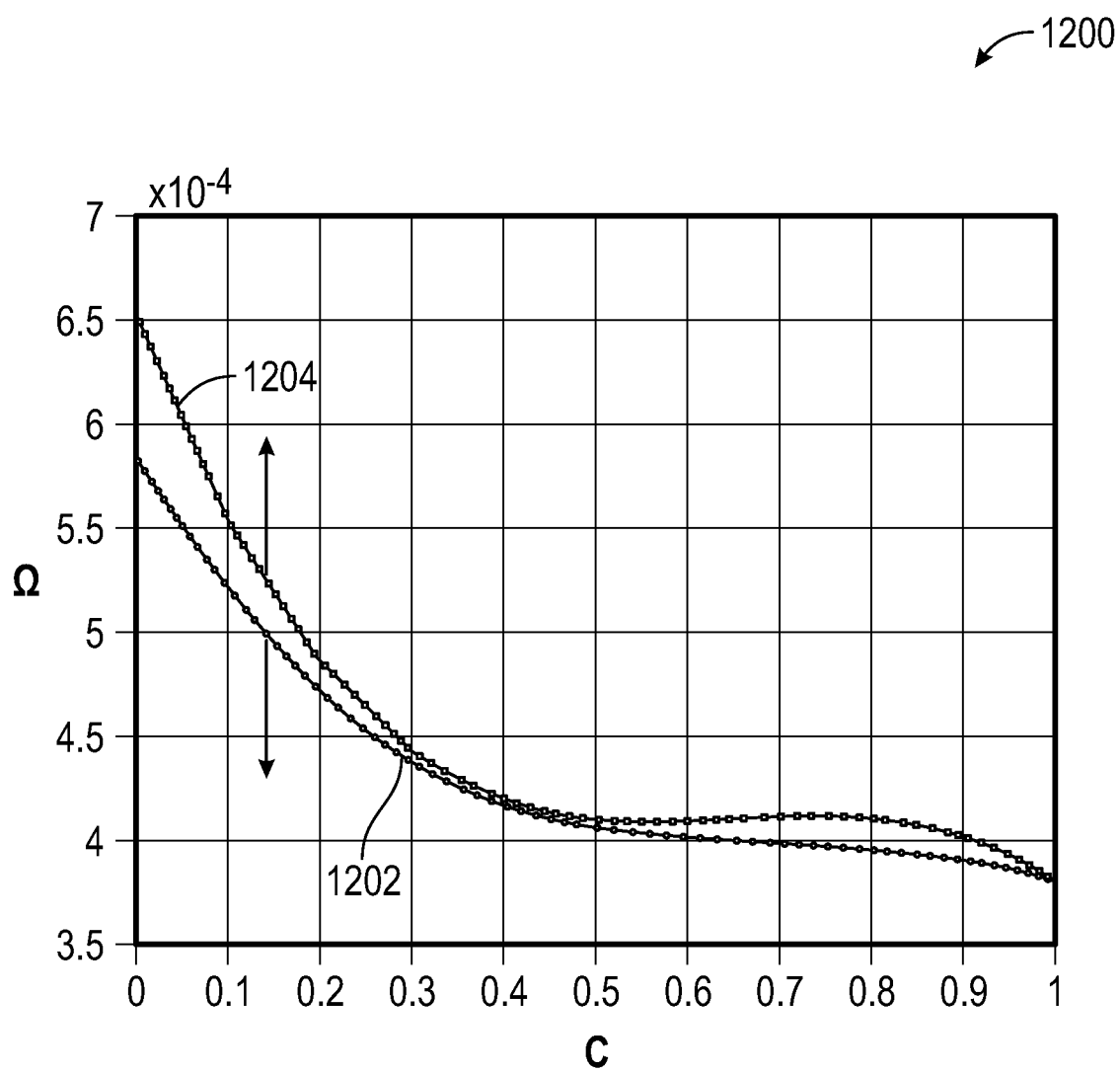
FIG. 12 shows a graph illustrating a relation between effective resistance and state of charge.

FIG. 12 shows a graph 1200 illustrating a relation between effective resistance and state of charge. The graph 1200 includes a first curve 1202 and a second curve 1204. The first curve 1202 represents the relation between effective resistance and SOCs during a charging event and a second curve 1004 represents the relation between effective resistance and SOC during a discharging event. The effective resistance and a given SOC is different depending on whether the battery cell is charging or discharging. At a selected SOC, a difference $\Delta R_{eff}$ can be calculated between the first curve 1202 and the second curve 1204.

The relation between effective resistance and an internal resistance $R_i$ of the battery cell is given by Eq. (8):

$$R_{eff} = R_i - \frac{R_i}{R_{isc}} \frac{V_t}{I_t} \quad \text{Eq. (8)}$$

The internal resistance changes nonlinearly with SOC as well as changes with temperature and gradually increases during aging. Understanding the relation between effective resistance and SOC separates the effects of aging and temperature from calculations used in determining a likelihood of thermal runaway.

FIG. 13 shows a graph 1300 comparing of effective resistance to the internal resistance of the battery cell during a discharging event. Time is shown along the abscissa in 10^4 seconds. The ordinate axis is unitless. The graph includes a broken line indicating times at which the effective resistance is greater than the average internal resistance. The line is broken when this inequality does not hold.

FIG. 14 shows a similar graph 1400 to FIG. 13 for when the battery cell is charging. Time is shown along the abscissa in 10^4 seconds. The ordinate axis is unitless. The sign constancy shown in FIGS. 13 and 14 can be used as an indication of a likelihood of a thermal runaway event.

Figure 15:
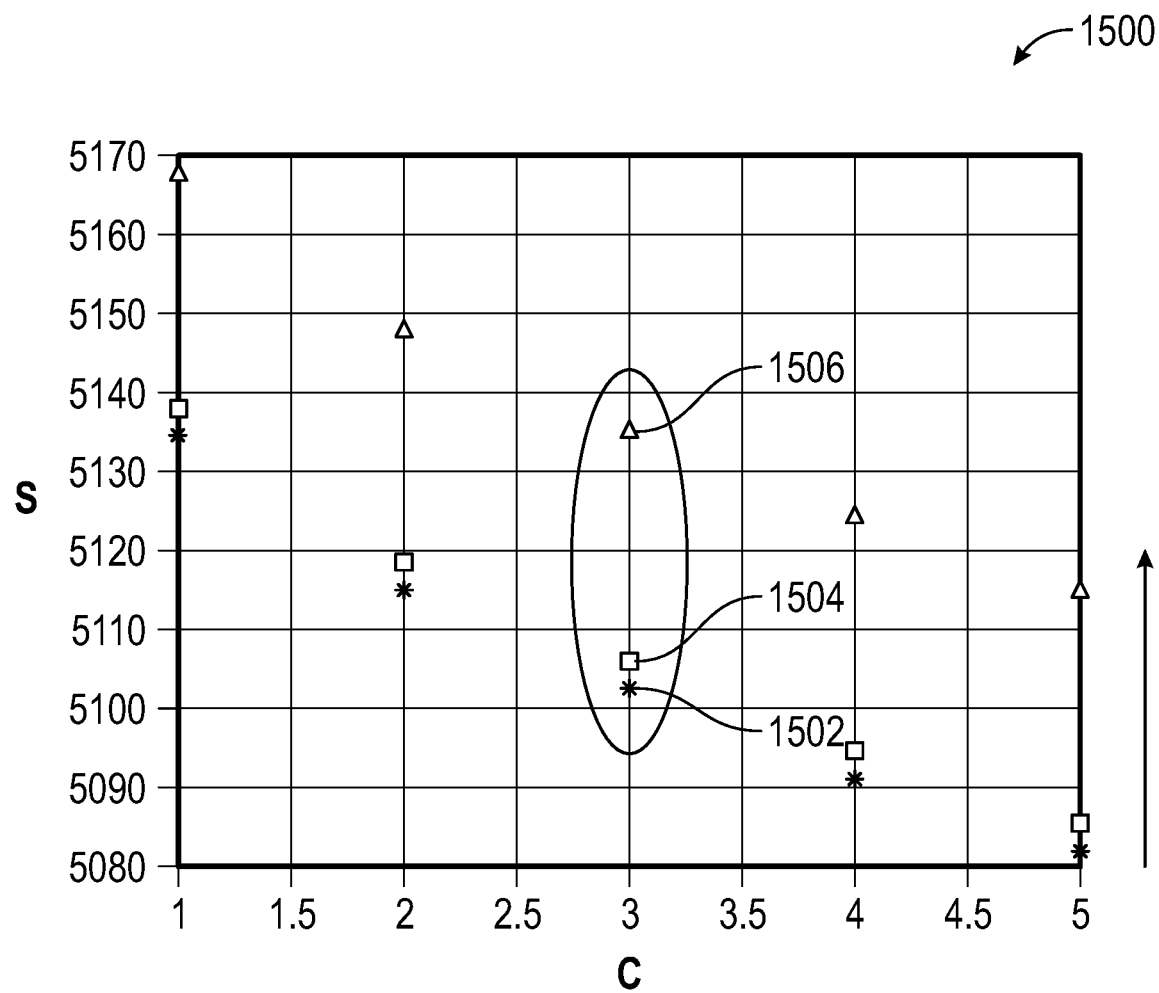
FIG. 15 shows a graph illustrating charging time for battery cells having different health conditions under different charging parameters.

FIG. 15 shows a graph 1500 illustrating charging time for battery cells having different health conditions under different charging parameters. The charging time for a battery cell can be directly related to the short-circuit resistance of the battery cell. The longer the time needed to charge the battery cell, the worse the health the battery cell is in. Different case numbers (C) are indicated along the abscissa and time is shown in seconds along the ordinate axis. Each case number indicates a different charging condition for the battery cell, such as different charging voltage, different charging current, different charging temperatures, different charging resistances, etc. Case #3 is selected for illustrative purposes. The charging time 1502 a healthy battery cell ($R_{isc}=\infty$) is about 5120 seconds. The charging time 1504 for the first faulty battery cell ($R_{isc}=100\Omega$) is about 5150 seconds. The charging time 1506 for the second faulty battery cell ($R_{isc}=10\Omega$) is about 5135 seconds. The charging times shown in FIG. 15 can be used to predict a likelihood of a thermal runaway event.

The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of predicting a thermal runaway event in a battery pack of a vehicle, comprising:
   obtaining measurements of a parameter of a battery cell of the battery pack at a plurality of times;
   determining a value of at least one feature of the battery cell from the measurements of the parameter;
   determining a likelihood of the thermal runaway event from the value of the at least one feature; and
   taking an action to prevent the thermal runaway event from occurring based on the likelihood.

2. The method of claim 1, wherein the feature is based on at least one of: (i) a relation between an open-circuit voltage and state of charge (SOC) of the battery cell at low SOC levels of the battery cell; (ii) a relation of power to SOC levels of the battery cell; (iii) a behavior of effective resistance with respect to SOC levels of the battery cell; and (iv) a behavior of charging rate with respect to a short resistance of the battery cell.

3. The method of claim 1, further comprising obtaining the measurements of the parameter when a computation window is active, wherein the computation window is active during a selected condition of the battery cell.

4. The method of claim 3, wherein the selected condition is at least one of: (i) a charging event; (ii) a discharging event; (iii) when a charge of the battery cell crosses a selected threshold value; and (iv) when a charge of the battery cell is within a selected SOC band.

5. The method of claim 1, wherein the likelihood includes a severity rank and a confidence value.

6. The method of claim 1, further comprising selecting a plurality of values of the at least one feature based on a selection criterion and determining the likelihood using the plurality of values.

7. The method of claim 1, further comprising calculating a plurality of likelihoods from the value of the at least one feature and calculating a composite likelihood from the plurality of likelihoods.

8. A system for predicting a thermal runaway event in a battery pack of a vehicle, comprising:
   a sensor for obtaining measurements of a parameter of a battery cell of the battery pack at a plurality of times; and
   a processor configured to:
      determine a value of at least one feature of the battery cell from the measurements of the parameter;
      determine a likelihood of the thermal runaway event from the value of the at least one feature; and
      take an action to prevent the thermal runaway event from occurring based on the likelihood.

9. The system of claim 8, wherein the feature is based on at least one of: (i) a relation between an open-circuit voltage and state of charge (SOC) of the battery cell at low SOC levels of the battery cell; (ii) a relation of power to SOC levels of the battery cell; (iii) a behavior of effective resistance with respect to SOC levels of the battery cell; and (iv) a behavior of charging rate with respect to a short resistance of the battery cell.

10. The system of claim 8, wherein the processor is further configured to obtain the measurements of the parameter when a computation window is active, wherein the computation window is active during a selected condition of the battery cell.

11. The system of claim 10, wherein the selected condition is at least one of: (i) a charging event; (ii) a discharging event; (iii) when a charge of the battery cell crosses a selected threshold value; and (iv) when a charge of the battery cell is within a selected SOC band.

12. The system of claim 8, wherein the likelihood includes a severity rank and a confidence value.

13. The system of claim 8, wherein the processor is further configured to select a plurality of values of the at least one feature based on a selection criterion and determining the likelihood using the plurality of values.

14. The system of claim 8, wherein the processor is further configured to calculate a plurality of likelihoods from the value of the at least one feature and calculate a composite likelihood from the plurality of likelihoods.

15. A vehicle, comprising:
   a battery pack having a battery cell;
   a sensor for obtaining measurements of a parameter of the battery cell at a plurality of times; and
   a processor configured to:
      determine a value of at least one feature of the battery cell from the measurements of the parameter;
      determine a likelihood of a thermal runaway event from the value of the at least one feature; and
      take an action to prevent the thermal runaway event from occurring based on the likelihood.

16. The vehicle of claim 15, wherein the feature is based on at least one of: (i) a relation between an open-circuit voltage and state of charge (SOC) of the battery cell at low SOC levels of the battery cell; (ii) a relation of power to SOC levels of the battery cell; (iii) a behavior of effective resistance with respect to SOC levels of the battery cell; and (iv) a behavior of charging rate with respect to a short resistance of the battery cell.

17. The vehicle of claim 15, wherein the processor is further configured to obtain the measurements of the parameter when a computation window is active, wherein the computation window is active during a selected condition of the battery cell.

18. The vehicle of claim 17, wherein the selected condition is at least one of: (i) a charging event; (ii) a discharging event; (iii) when a charge of the battery cell crosses a selected threshold value; and (iv) when a charge of the battery cell is within a selected SOC band.

19. The vehicle of claim 15, wherein the processor is further configured to select a plurality of values of the at least one feature based on a selection criterion and determining the likelihood using the plurality of values.

20. The vehicle of claim 15, wherein the processor is further configured to calculate a plurality of likelihoods from the value of the at least one feature and calculate a composite likelihood from the plurality of likelihoods.

\* \* \* \* \*